United States Patent
Barish et al.

(10) Patent No.: US 7,235,994 B2
(45) Date of Patent: Jun. 26, 2007

(54) DEFECT MONITOR FOR SEMICONDUCTOR MANUFACTURING CAPABLE OF PERFORMING ANALOG RESISTANCE MEASUREMENTS

(75) Inventors: Arnold E. Barish, Pleasant Valley, NY (US); Norman Karl James, Liberty Hill, TX (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 10/902,668

(22) Filed: Jul. 29, 2004

(65) Prior Publication Data

US 2006/0022695 A1   Feb. 2, 2006

(51) Int. Cl.
*G01R 31/26* (2006.01)
(52) U.S. Cl. .................................................. 324/765
(58) Field of Classification Search ............... None
See application file for complete search history.

(56) References Cited

U.S. PATENT DOCUMENTS 4,719,411 A * 1/1988 Buehler .................... 324/73.1

* cited by examiner

*Primary Examiner*—Jermele Hollington
*Assistant Examiner*—Trung Q. Nguyen
(74) *Attorney, Agent, or Firm*—Duke W. Yee; Libby Z. Handelsman; Mary Adams-Moe

(57) ABSTRACT

A mechanism is provided to address a structure under test and to identify a point of failure. A test open line carries a signal that indicates whether a structure under test is open or closed. A test short line carries a signal that indicates whether a structure under test is shorted. A test structure may include an array of cells, where each cell includes a circuit including structures to test. The cells may be scanned using scan only latches and signals on the test open and/or test short lines may be recorded. A test circuit may include a digital mode and an analog mode. The digital mode provides an open or closed value. The analog mode includes a programmable load. The output of the analog mode provides a resistance value that is relative to the programmable load.

5 Claims, 3 Drawing Sheets

DEFECT MONITOR FOR SEMICONDUCTOR MANUFACTURING CAPABLE OF PERFORMING ANALOG RESISTANCE MEASUREMENTS

BACKGROUND OF THE INVENTION

1. Technical Field

The present invention relates to semiconductor manufacturing and, in particular, to testing of semiconductor devices. Still more particularly, the present invention provides a defect monitor for semiconductor manufacturing capable of performing analog resistance measurements.

2. Description of Related Art

Bringing up a new semiconductor can be challenging and requires a variety of yield monitors to determine the health of the process and to find systematic problems. Several known structures, such as long wires, minimum spaced wires, and via chains are used to determine back end of line health. Back end of line (BEOL) includes wires and vias. Front end of line (FEOL) includes transistors and other devices. Wires may appear in metal layers or in the semiconductor itself. Vias are used to connect metal layers to other metal layers or to portions of the semiconductor device.

When a long wire is fabricated, a defect may occur where the wire is open at a point in the circuit. Similarly, a via chain may be defective if the via chain is left open. On the other hand, minimum spaced wires may exist in a semiconductor device. If these wires are shorted, then the structures are defective.

To find random defects, one must isolate defects to a small area so failure analysis can study the defect. The surrounding support logic for the BEOL structures must be capable of isolating the failure. However, isolating defects in the BEOL structures has proven to be difficult and unreliable.

SUMMARY OF THE INVENTION

The present invention provides a mechanism to address a structure under test and to identify a point of failure. In one preferred embodiment, a path is provided in a test structure from a test open line through the structure under test and a transistor to ground. The test open line carries a signal that indicates whether the structure under test is open or closed. If the structure under test is open, then the structure under test fails.

In another preferred embodiment, a test structure is provided in which a first structure under test is connected to a test short line and a second structure under test is connected through a transistor to ground, wherein a critical spacing exists between the first test structure and the second test structure. The test short line carries a signal that indicates whether the critical spacing is shorted. If the critical spacing is shorted, then the structures under test fail.

A test structure may include an array of cells, where each cell includes a circuit including structures to test. The cells may be scanned using scan only latches and signals on the test open and/or test short lines may be recorded. A test circuit may include a digital mode or an analog mode. The digital mode provides an open or closed value. The analog mode includes a programmable load. The output of the analog mode provides a resistance value that is relative to the programmable load.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
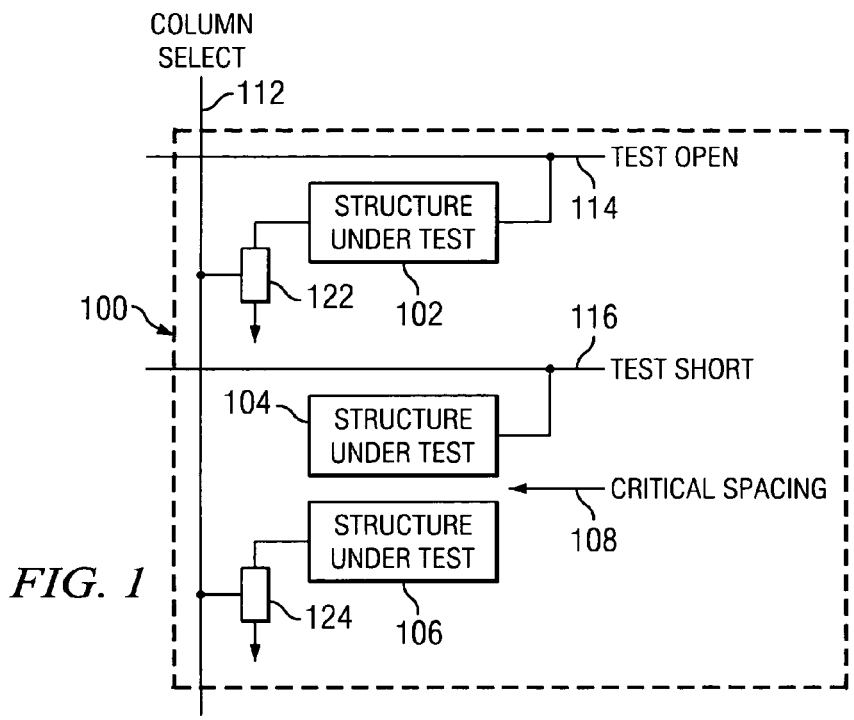
FIG. 1 depicts a pictorial representation of a cell in a test structure in accordance with an exemplary embodiment of the present invention.

With reference now to the figures, FIG. 1 depicts a pictorial representation of a cell in a test structure in accordance with an exemplary embodiment of the present invention. Cell 100 is a semiconductor device that includes structures under test 102, 104, 106. More particularly, structure under test 102 may be a long wire or via chain, for example. Wires may appear in metal layers or in the semiconductor. Cell 100 may be one of many semiconductor devices on a chip. A chip may have ten or more metal layers. Vias are used to connect metal layers to other metal layers or to portions of the semiconductor. Cell 100 is a test structure that is designed to isolate structures under test 102, 104, 106 and critical spacing 108 to determine whether structure under test 102 is defective.

Structure under test 102 is connected to test open line 114. Structure under test 102 is also connected through transistor 122 to ground. Transistor 122 may be, for example, an N-type field effect transistor (NFET). When column select line 112 is asserted, then transistor 122 turns on and test open line 114 should be pulled to ground. However, if structure under test 102 is open, then test open line 114 will not be pulled to ground. In this manner, one may determine whether structure under test 102 is defective.

Structure under test 104 and structure under test 106 may be separated by a critical or minimum spacing 108. The spacing of components becomes more dense as semiconductor devices become smaller and smaller. Structures under test 104, 106 may be, for example, wires or via chains. A defect may occur where structures under test 104, 106 are shorted.

Structure under test 104 is connected to test short line 116. Structure under test 106 is connected through transistor 124 to ground. Transistor 124 may be, for example, an NFET. When column select line 112 is asserted, test short line 116 should not be pulled to ground if the proper critical spacing 108 exists. However, if a defect occurs and test structures 104, 106 are shorted, test short line 116 will be pulled to ground. In this manner, one may determine whether structures under test 104, 106 or, more appropriately, critical spacing 108, is defective.

In the depicted example, the cell includes one structure under test 102 that may be a long wire or via chain and two structures under test 104, 106 that are separated by critical spacing 108. However, cell 100 may include other combinations of structures under test depending upon the implementation. For example, one test structure may be designed to test only critical spacings while another test structure may be designed to test only wires and via chains. In a typical implementation of the present invention, many such test structures may be designed to isolate the various structures in a semiconductor circuit design.

Figure 2:
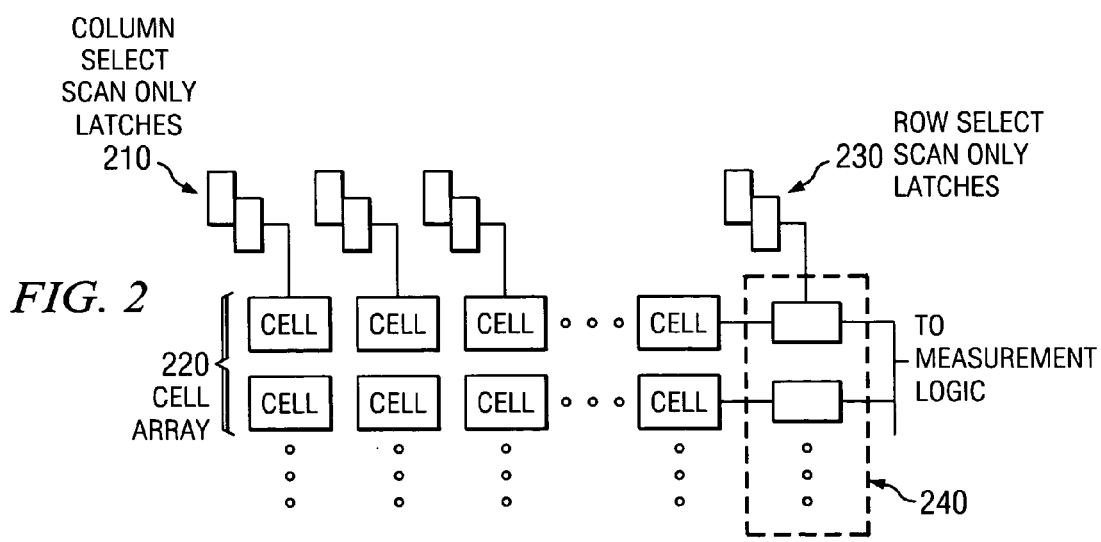
FIG. 2 depicts a semiconductor circuit including an array of test cells in accordance with an exemplary embodiment of the present invention.

FIG. 2 depicts a semiconductor circuit including an array of test cells in accordance with an exemplary embodiment of the present invention. The semiconductor circuit includes cell array 220. Each cell in cell array 220 may be a test cell, such as cell 100 in FIG. 1.

The array size may be, for example, 100×100 resulting in 10,000 addressable structures under test. A single row of 100 cells may be selected with a dotted passgate 240. Row select scan only latches 230 include a latch for each row in cell array 220. The columns are selected with scan only latches 210 and the rows are selected with scan only latches 230. Test open lines and/or test short lines, as addressed using column select scan only latches 210 and row select scan only latches 230, are provided to measurement logic, as illustrated in FIG. 2.

Figure 3:
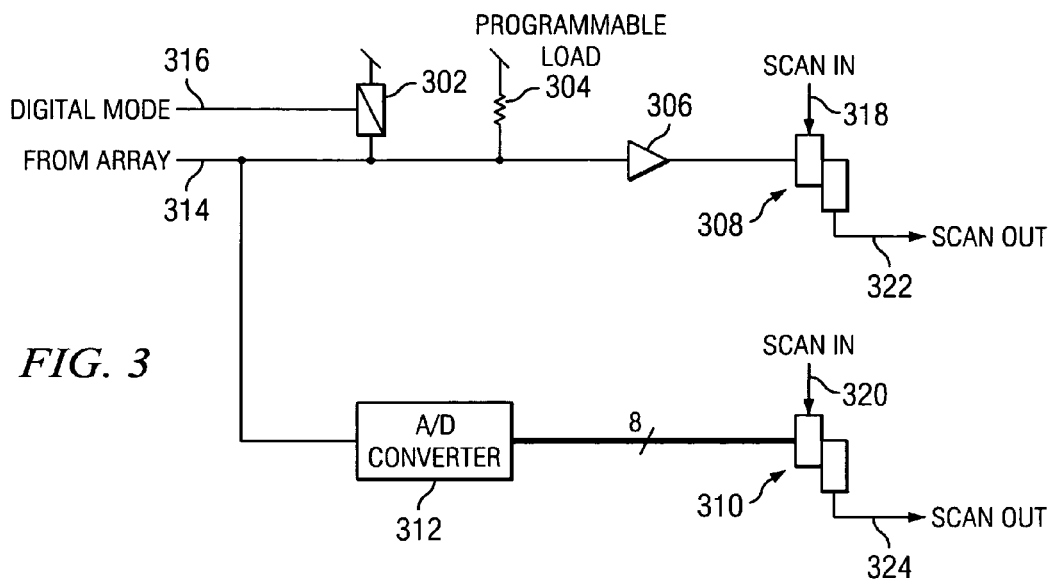
FIG. 3 illustrates an exemplary measurement circuit in accordance with a preferred embodiment of the present invention.

Turning to FIG. 3, an exemplary measurement circuit is illustrated in accordance with a preferred embodiment of the present invention. Measurement signals are received on line 314 from an array of test cells. To turn on digital mode, digital mode signal 316 is asserted and programmable load 304 is opened (set to a very high resistance). To turn on analog mode, digital mode signal 316 is deasserted and programmable load 304 is set to a predetermined level.

When digital mode signal 316 is asserted, transistor 302 is turned on. Transistor 302 may be, for example, a P-type field effect transistor (PFET). Amplifier 306 sends an amplified signal to latches 308. When scan in signal 318 is asserted, the signal is passed to scan out line 322. In digital mode, transistor 302 appears as open if the resistance of the structure under test is greater than a predetermined value, such as 2 k ohms. In other words, if the structure under test is open (>2 k ohms), the value at amplifier 306 will be high and, thus, the value at scan out line 322 will be high. Otherwise, if the structure under test is not open (i.e., not defective), then the value at amplifier 306 will be low and, thus, the value at scan out line 322 will be low.

When digital mode signal 316 is deasserted, transistor 302 is turned off. Current flows through programmable load 304 to A/D converter 312, which measures the resistance of the structure under test from the array and converts this value to an 8-bit digital value. The resistance of the structure under test is measured relative to the resistance of programmable load 304. The digital value from A/D converter 312 is passed to latch 310. When scan in signal 320 is asserted, the signal is passed to scan out line 324.

Line 314 from the array of test cells may be connected to a test open line or test short line from the array. Thus, the circuit depicted in FIG. 3 may be used to determine whether a wire or via chain is open or to determine whether a critical spacing is shorted. Furthermore, the circuit depicted in FIG. 3 may be used in digital mode to determine whether the structure under test is open or shorted and may be used in analog mode to measure the resistance of the structure under test. A measurement circuit may be provided for each structure under test.

Figure 4:
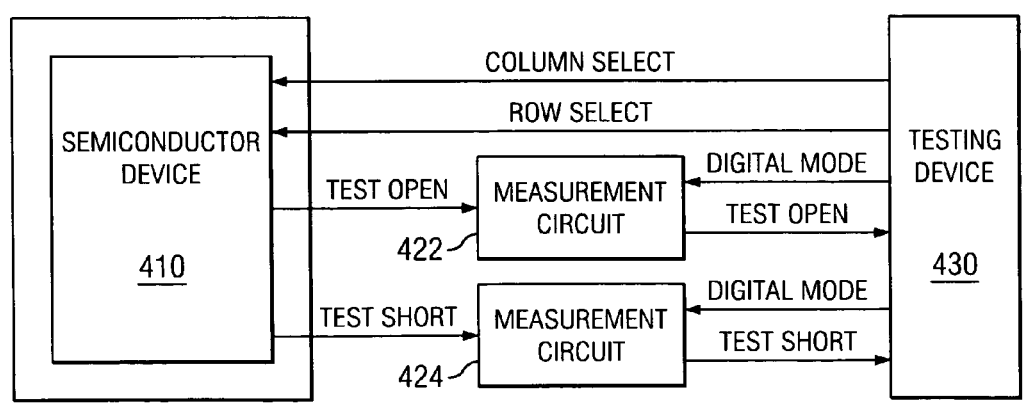
FIG. 4 is a block diagram depicting a testing environment in accordance with a preferred embodiment of the present invention.

FIG. 4 is a block diagram depicting a testing environment in accordance with a preferred embodiment of the present invention. Testing device 430 is connected to semiconductor device 410. Testing device 430 may be, for example, a general purpose computer programmed with testing software for scanning the rows and columns of the semiconductor device 410 and analyzing the resulting output.

Testing device provides column select and row select signals to scan the rows and columns of an array of test cells in semiconductor device 410. As testing device 430 scans the rows and columns, semiconductor device 410 provides signals on the test open and test short lines. The test open line is connected to measurement circuit 422. The test short line is connected to measurement circuit 424.

Testing device 430 provides a digital mode enable signal to measurement circuits 422, 424. Measurement circuit 422 provides a digital test open signal, if the digital mode is enabled, or an analog measurement of the resistance of the structure under test, such as a wire or via chain, to testing device 430. Measurement circuit 424 provides a digital test short signal, if the digital mode is enabled, or an analog measurement of the resistance of the structure under test, such as a critical spacing, to testing device 430.

Testing device 430 then analyzes the digital test open and test short signals or the measured resistance values. Based on this analysis, testing device 430 may identify rows and columns and, hence, the corresponding cells, that have defective structures under test. Testing device 430 may be, for example, an automated test equipment device. Automated test equipment (ATE) is computer controlled test and measurement equipment, arranged in such a way as to be able to test a unit with minimal human interaction. The advantage of this kind of test is that the tests are repeatable and cost efficient in high volume. Existing ATE devices include models made by Agilent Technologies and Teradyne Inc., for example.

Figure 5:
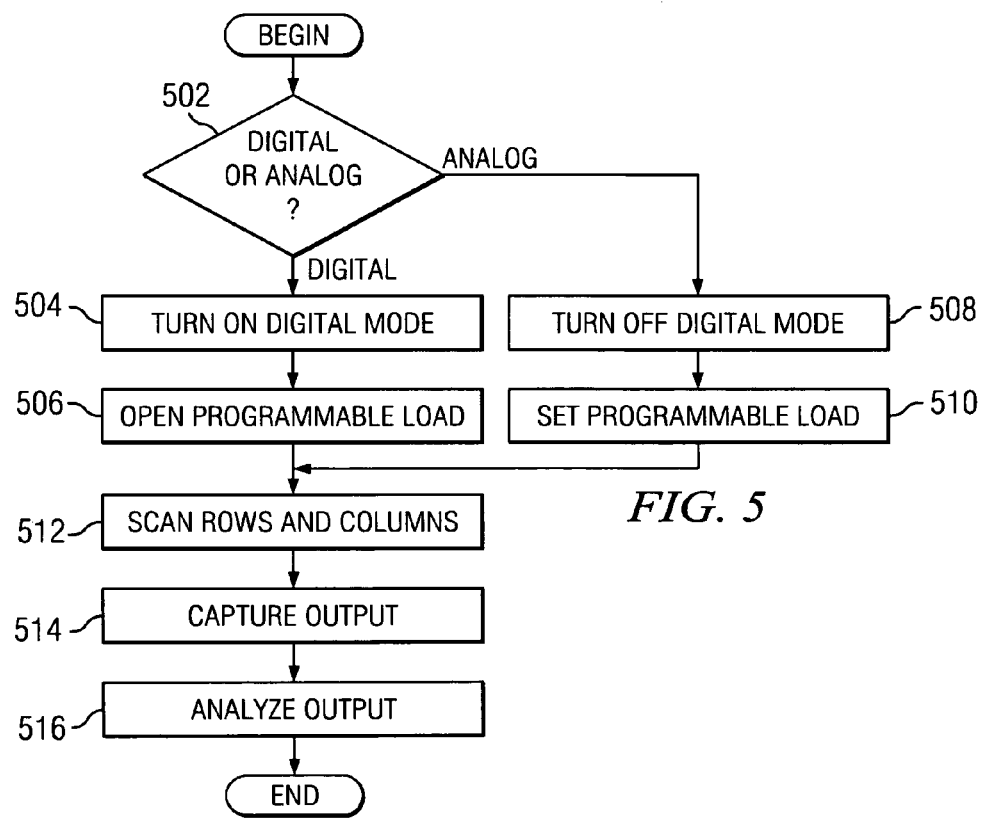
FIG. 5 is a block diagram of a data processing system in which the present invention may be implemented.

FIG. 5 is a flowchart illustrating operation of a testing device in accordance with an exemplary embodiment of the present invention. Operation begins and the testing device determines whether testing is to be performed in digital or analog mode (block 502). If testing is to be performed in digital mode, the testing device asserts a digital mode signal to turn on digital mode (block 504) and the programmable load is opened (block 506). If testing is to be performed in analog mode in block 502, the testing device deasserts the digital mode signal to turn off digital mode (block 508) and the programmable load is set to a predetermined value (block 510).

After the programmable load is opened in block 506 or set to a predetermined value in block 510, the testing device scans the rows and columns of the semiconductor device being tested (block 512). The testing device then captures output from measurement circuits (block 514) and analyzes the output (block 516) to identify defective structures under test within the semiconductor device. Thereafter, operation ends.

Thus, the present invention solves the disadvantages of the present invention by providing a mechanism to address a structure under test and to identify a point of failure. A test open line carries a signal that indicates whether a structure under test is open or closed. A test short line carries a signal that indicates whether a structure under test is shorted. A test structure may include an array of cells, where each cell includes a circuit including structures to test. The cells may be scanned using scan only latches and signals on the test open and/or test short lines may be recorded. A test circuit may include a digital mode and an analog mode. The digital mode provides an open or closed value. The analog mode includes a programmable load. The output of the analog mode provides a resistance value that is relative to the programmable load.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for testing test structures in an array of test structures in a semiconductor device, the method comprising:

addressing a first structure under test, wherein the first structure under test is separated from a second structure under test by a critical spacing;

connecting the first structure under test to a test line;

connecting the second structure under test through a transistor to ground, wherein there is no connection between the first structure under test and the second structure under test; and responsive to receiving a shorted test signal on the test line, determining that a critical spacing failure has occurred.

2. The method of claim 1, wherein the first or second structure under test includes one of a wire and a via.

3. The method of claim 1, wherein the transistor is activated by a column select signal.

4. The method of claim 1, wherein the semiconductor device includes an array of cells and wherein addressing the first structure under test includes addressing a row and column in the array of cells.

5. The method of claim 1, wherein determining whether the addressed first structure under test is open or shorted includes determining a resistance of the first structure under test.

* * * * *